US010697072B2

(12) United States Patent
Shin et al.

(10) Patent No.: US 10,697,072 B2
(45) Date of Patent: Jun. 30, 2020

(54) PHOTOELECTRODE INCLUDING CATALYST RETAINING LAYER, METHOD OF PREPARING THE SAME, AND PHOTOELECTROCHEMICAL CELL INCLUDING PHOTOELECTRODE

(71) Applicant: KOREA ADVANCED INSTITUTE OF SCIENCE AND TECHNOLOGY, Daejeon (KR)

(72) Inventors: Byungha Shin, Daejeon (KR); Bonhyeong Koo, Daejeon (KR); Segi Byun, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 15/923,065

(22) Filed: Mar. 16, 2018

(65) Prior Publication Data

US 2019/0062929 A1    Feb. 28, 2019

(30) Foreign Application Priority Data

Aug. 24, 2017 (KR) .................. 10-2017-0106999
Jan. 22, 2018 (KR) .................. 10-2018-0007969

(51) Int. Cl.
| C02F 1/30 | (2006.01) |
| C25B 9/00 | (2006.01) |
| C25B 1/00 | (2006.01) |
| C25B 1/04 | (2006.01) |
| C25B 11/04 | (2006.01) |
| H01L 31/18 | (2006.01) |
| B05D 1/00 | (2006.01) |
| B01J 21/18 | (2006.01) |
| H01L 31/054 | (2014.01) |
| B01J 37/34 | (2006.01) |

(Continued)

(52) U.S. Cl.
CPC .............. *C25B 1/003* (2013.01); *B01J 21/18* (2013.01); *B01J 35/004* (2013.01); *B01J 37/348* (2013.01); *B05D 1/005* (2013.01); *C25B 1/04* (2013.01); *C25B 11/0478* (2013.01); *H01L 31/054* (2014.12); *H01L 31/0749* (2013.01); *H01L 31/1828* (2013.01)

(58) Field of Classification Search
CPC .............. C25B 1/003; C25B 9/00; C02F 1/30
USPC ....................................... 204/248
See application file for complete search history.

(56) References Cited

U.S. PATENT DOCUMENTS

| 2005/0214528 A1* | 9/2005 | Iijima | ................... B32B 3/16 428/343 |
| 2014/0021034 A1* | 1/2014 | Lewis | ................... H01G 9/20 204/157.15 |
| 2018/0073153 A1* | 3/2018 | Yamada | ................ B05D 1/005 |

FOREIGN PATENT DOCUMENTS

| KR | 1020140139162 A | 12/2014 |
| KR | 1020150143133 A | 12/2015 |

(Continued)

OTHER PUBLICATIONS

Kim et al.; "Platinum-decorated Cu(InGa)Se2/CdS photocathodes: Optimization of Pt electrodeposition time and pH level", Journal of Alloys and Compounds, 692(2017), pp. 294-300.

*Primary Examiner* — Zulmariam Mendez
(74) *Attorney, Agent, or Firm* — Hamre, Schumann, Mueller & Larson, P.C.

(57) ABSTRACT

The present disclosure relates to a photoelectrode including a catalyst retaining layer, a method of preparing the same, and a photoelectrochemical cell including the photoelectrode.

9 Claims, 11 Drawing Sheets

(51) Int. Cl.
*H01L 31/0749* (2012.01)
*B01J 35/00* (2006.01)

(56) References Cited

FOREIGN PATENT DOCUMENTS

| | | |
|---|---|---|
| KR | 101724690 B1 | 4/2017 |
| KR | 1020170051575 A | 5/2017 |
| KR | 101745822 B1 | 6/2017 |
| WO | 2015190108 A1 | 12/2015 |

* cited by examiner

FIG. 3

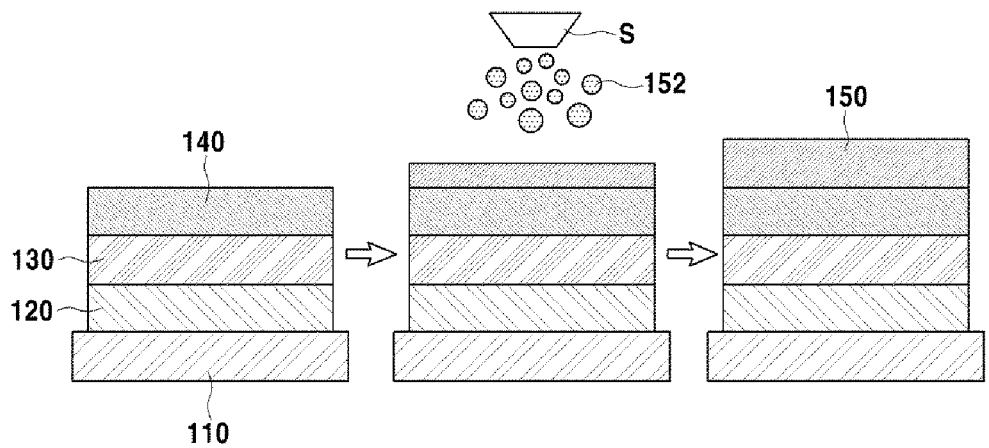

FIG. 4

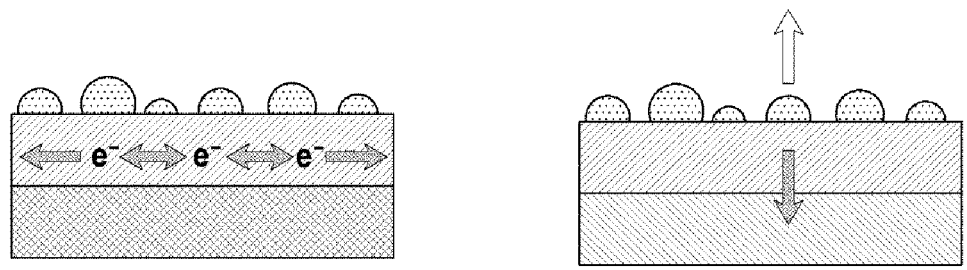

Improvement of lateral mobility of electrons in a catalyst retaining layer
-> Improvement of mobility to the locally configured catalyst
-> Increasing efficiency The catalyst retaining layer binds the metal catalyst contained in the catalyst layer to reduce desorption of the metal catalyst or in-diffusion ⇔ : Lateral movement
⇧ : Desorption to electrolyte
⇩ : In-diffusion

PHOTOELECTRODE INCLUDING CATALYST RETAINING LAYER, METHOD OF PREPARING THE SAME, AND PHOTOELECTROCHEMICAL CELL INCLUDING PHOTOELECTRODE

CROSS-REFERENCE TO RELATED APPLICATION

This application claims the benefit under 35 USC 119(a) of Korean Patent Application No. 10-2017-0106999 filed on Aug. 24, 2017 and No. 10-2018-0007969 filed on Jan. 22, 2018 in the Korean Intellectual Property Office, the entire disclosures of which are incorporated herein by reference for all purposes.

STATEMENT REGARDING THIRD PARTY RESEARCH PROJECT

This invention was made with Korean government support under Project No. 2017071572 with 50% contribution sponsored by the Ministry of Science, ICT and Future Planning, Republic of Korea under Research Project Title: "Development of alkali-treatment and surface treatment for high efficiency flexible CIGS solar cell". The research period runs from Sep. 1, 2017. through Jun. 30, 2018. The beneficiary of said sponsorship is Korea Institute of Energy Research.

This invention was also made with Korean government support under Project No. 20173010012980 with 50% contribution sponsored by the Ministry of Trade, Industry and Energy, Republic of Korea under Research Project Title: "Development of earth abundant, non-toxic chalcogenide absorber-based flexible inorganic thin-film solar cell". The research period runs from May 1, 2017. through Apr. 30, 2021. The beneficiary of said sponsorship is Daegu Gyeongbuk Institute of Science and Technology.

TECHNICAL FIELD

The present disclosure relates to a photoelectrode including a catalyst retaining layer, a method of preparing the same, and a photoelectrochemical cell including the photoelectrode.

BACKGROUND

With a recent increasing interest in eco-friendly resources, systems for generating hydrogen and oxygen using the sun light and water are being researched.

In a water splitting photoelectrode, the photoelectrode typically has a substrate/electrode/photoactive layer/catalyst structure, and when the photoelectrode operates, the cathode supplies electrons from the sun light to reduce water and thus generate hydrogen gas and the anode supplies holes to oxidize water and thus generate oxygen gas.

In this regard, Korean Patent No. 10-1724690 discloses a manufacturing method of water splitting photoelectrode based on Fe—Ni alloy by anodization and a water splitting electrode manufactured thereby.

Meanwhile, a transition metal is mainly used as a catalyst of a photoelectrode for cathode. In the case where the metal catalyst is used, the metal catalyst is desorbed or detached from the photoactive layer in a short time after redox starts, and, thus, the stability of the photoelectrode decreases over time.

Further, in the conventional photoelectrode for cathode, segregation of the metal catalyst occurs, and the metal catalyst desorbed from the photoactive layer is diffused into the photoelectrode or toward the electrolyte. Thus, photoelectrochemical properties of the photoelectrode may decrease over time.

SUMMARY

In view of the foregoing, the present disclosure provides a photoelectrode including a catalyst retaining layer, a method of preparing the same, and a photoelectrochemical cell including the photoelectrode.

However, problems to be solved by the present disclosure are not limited to the above-described problems. Although not described herein, other problems to be solved by the present disclosure can be clearly understood by those skilled in the art from the following descriptions.

A first aspect of the present disclosure provides a photoelectrode for cathode, including: an electrode formed on a substrate; a photoactive layer formed on the electrode and configured to receive light and generate an electron; a catalyst retaining layer formed on the photoactive layer and configured to improve the mobility of the electron; and a catalyst layer formed on the catalyst retaining layer and containing a metal catalyst, and the catalyst retaining layer binds the metal catalyst contained in the catalyst layer to reduce desorption of the metal catalyst from the catalyst layer.

A second aspect of the present disclosure provides a photoelectrochemical cell including: the photoelectrode according to the first aspect of the present disclosure; a counter electrode electrically connected with the photoelectrode; and an electrolyte.

Further, a third aspect of the present disclosure provides a method of preparing a photoelectrode for cathode, including: forming an electrode on a substrate; forming a photoactive layer configured to receive light and generate an electron on the electrode; forming a catalyst retaining layer configured to improve the mobility of the electron on the photoactive layer; and forming a catalyst layer containing a metal catalyst on the catalyst retaining layer, and the catalyst retaining layer binds the metal catalyst contained in the catalyst layer to reduce desorption of the metal catalyst from the catalyst layer.

According to exemplary embodiments of the present disclosure, the catalyst retaining layer can improve the mobility of the electron generated by the photoactive layer and thus improve photoelectrochemical conversion efficiency of the photoelectrode. Further, the catalyst retaining layer can suppress corrosion of the substrate, the electrode, the photoactive layer, or internal components of the electrode such as a buffer layer within an electrolyte solution and thus improve stability and durability of the photoelectrode. Besides, the catalyst retaining layer can bind the metal catalyst contained in the catalyst layer and thus reduce desorption of the metal catalyst from the catalyst layer and diffusion of the metal catalyst into the photoelectrode or segregation of the metal catalyst and also reduce detachment of the catalyst material to an electrolyte outside the photoelectrode. Therefore, the catalyst retaining layer can reduce catalyst loss and improve photoelectrochemical properties (photoelectrochemical conversion efficiency) and stability of the photoelectrode for cathode.

According to exemplary embodiments of the present disclosure, in the method of preparing the photoelectrode for cathode, the forming of the catalyst retaining layer is completed in a short time (30 minutes) by using a non-vacuum spray coating method in which drying is performed at a low processing temperature of 70° C. Such a relatively simple process can reduce cost.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2A is a flowchart illustrating a method of preparing a photoelectrode having a lamination of electrode/photoactive layer/catalyst retaining layer/catalyst layer and FIG. 2B is a flowchart illustrating a method of preparing a photoelectrode having a lamination of electrode/photoactive layer/buffer layer/catalyst retaining layer/catalyst layer.

FIG. 3 is a schematic diagram illustrating a process of forming a catalyst retaining layer.

FIG. 4 is a schematic diagram illustrating the effects which can be obtained by including a catalyst retaining layer.

DETAILED DESCRIPTION

Figure 1:
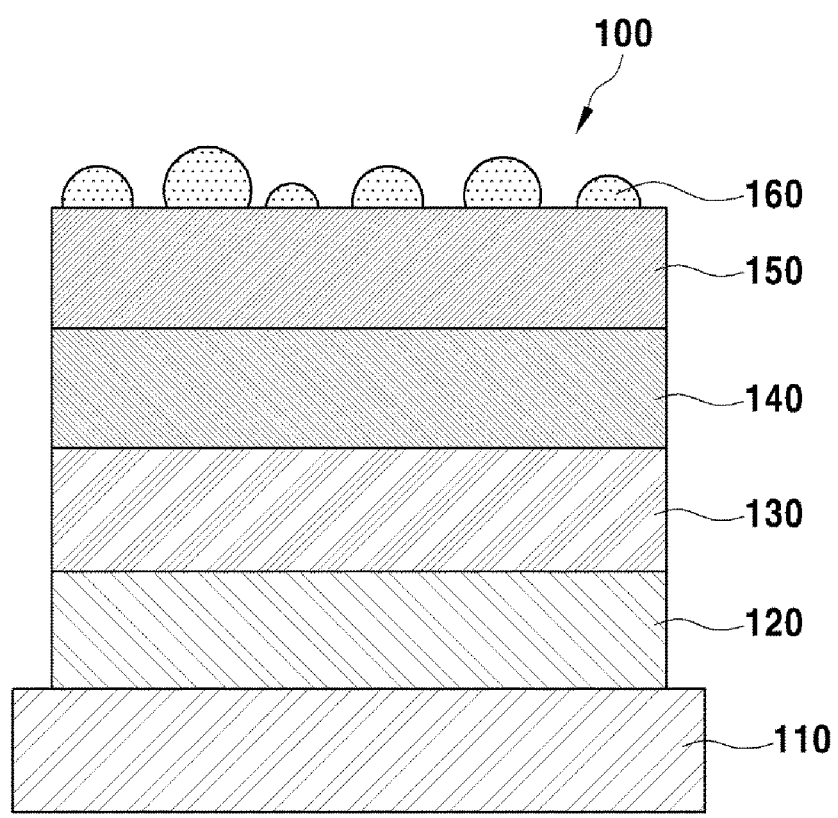
FIG. 1 is a schematic diagram illustrating an overall structure of a photoelectrode.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the other element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party.

Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

A first aspect of the present disclosure provides a photoelectrode for cathode, including: an electrode formed on a substrate; a photoactive layer formed on the electrode and configured to receive light and generate an electron; a catalyst retaining layer formed on the photoactive layer and configured to improve the mobility of the electron; and a catalyst layer formed on the catalyst retaining layer and containing a metal catalyst, and the catalyst retaining layer binds the metal catalyst contained in the catalyst layer to reduce desorption of the metal catalyst from the catalyst layer.

In an exemplary embodiment of the present disclosure, the photoelectrode can be used as a cathode, and for example, if the photoelectrode is used in water splitting, the photoelectrode may generate hydrogen due to a reduction reaction in which hydrogen ions are combined with electrons, but may not be limited thereto.

In an exemplary embodiment of the present disclosure, the photoelectrode for cathode may include a light absorption layer configured to receive light from an external light source, a catalyst retaining layer configured to protect the light absorption layer from an electrolyte, improve the charge transfer efficiency and reduce or suppress desorption of a metal catalyst, and a catalyst layer configured to reactive electrons generated from the light absorption layer and passing through the catalyst retaining layer to make an electrochemical reaction, but may not be limited thereto.

In an exemplary embodiment of the present disclosure, the catalyst retaining layer of the photoelectrode for cathode may function to improve the photoelectrode corrosion resistance to the electrolyte, improve the interfacial binding force between the photoactive layer and the metal catalyst or between a buffer layer and the metal catalyst, protect the inside of the photoelectrode, improve the charge transfer, and reduce or suppress the diffusion of the metal catalyst into the photoelectrode, but may not be limited thereto.

In an exemplary embodiment of the present disclosure, the photoelectrode may further include a buffer layer between the photoactive layer and the catalyst retaining layer or between the electrode and the photoactive layer, but may not be limited thereto.

In an exemplary embodiment of the present disclosure, the photoelectrode may have a structure in which the electrode, the photoactive layer, the buffer layer, the catalyst retaining layer, and the catalyst layer or the electrode, the buffer layer, the photoactive layer, the catalyst retaining layer, and the catalyst layer may be laminated in sequence, but may not be limited thereto.

In an exemplary embodiment of the present disclosure, the catalyst retaining layer may contain a carbonaceous material, but may not be limited thereto.

In an exemplary embodiment of the present disclosure, the carbonaceous material may include reduced graphene oxide (rGO) or graphene oxide (GO), but may not be limited thereto.

In an exemplary embodiment of the present disclosure, the catalyst retaining layer may have a thickness of from about 0.3 nm to about 3 nm, but may not be limited thereto.

For example, the catalyst retaining layer may have a thickness of from about 0.3 nm to about 3 nm, from about 0.3 nm to about 2.5 nm, from about 0.3 nm to about 2 nm, from about 0.3 nm to about 1.5 nm, from about 0.3 nm to about 1 nm, from about 1 nm to about 3 nm, from about 1 nm to about 2.5 nm, from about 1 nm to about 2 nm, from about 1 nm to about 1.5 nm, from about 1.5 nm to about 3 nm, from about 1.5 nm to about 2.5 nm, from about 1.5 nm to about 2 nm, from about 2 nm to about 3 nm, from about 2 nm to about 2.5 nm, or from about 2.5 nm to about 3 nm, but may not be limited thereto.

In an exemplary embodiment of the present disclosure, if the catalyst retaining layer has a thickness of less than about 0.3 nm, the absolute amount of the catalyst retaining layer may be decreased and the surface coverage may be decreased, and, thus, corrosion caused by penetration of the electrolyte and catalyst loss may occur, and if the catalyst retaining layer has a thickness of more than about 3 nm, the catalyst retaining layer may be desorbed by van der Waals forces, and, thus, corrosion and catalyst loss may occur, but the present disclosure may not be limited thereto.

In an exemplary embodiment of the present disclosure, the catalyst retaining layer may improve the mobility of an electron within the catalyst retaining layer, but may not be limited thereto.

For example, if reduced graphene oxide (rGO) is used as the catalyst retaining layer, the mobility of an electron can be improved due to a shorter distance between carbon atoms in the reduced graphene oxide (rGO) than in non-reduced graphene oxide (GO), but may not be limited thereto.

In an exemplary embodiment of the present disclosure, the catalyst retaining layer may bind the metal catalyst contained in the catalyst layer to reduce or suppress desorption of the metal catalyst from the catalyst layer, but may not be limited thereto.

In an exemplary embodiment of the present disclosure, the desorption of the metal catalyst from the catalyst layer may include desorption of the metal catalyst into the electrolyte or diffusion of the metal catalyst into an internal component (e.g., buffer layer) of the photoelectrode, but may not be limited thereto.

For example, if the reduced graphene oxide (rGO) is used as the catalyst retaining layer, the rGO may have a functional group on the interface with the catalyst layer, and since the functional group binds the metal catalyst, separation of the metal catalyst from the catalyst layer can be reduced or suppressed, but the present disclosure may not be limited thereto.

In an exemplary embodiment of the present disclosure, the functional group may include, for example, oxygenated species, dangling bonds, or kinks, but may not be limited thereto.

In an exemplary embodiment of the present disclosure, the catalyst layer may include a metal element selected from the group consisting of Pt, Co, Rh, Ir, Ru, Re, Au, Ag, Cu, Ni, Mo, Fe, Sn, Bi, Zn, Ga, Pb, Sn, Ti, In, Cd, W, Ta, Nb, and combinations thereof, but may not be limited thereto.

In an exemplary embodiment of the present disclosure, the catalyst layer of the photoelectrode for cathode contains the metal catalyst, and, thus, the photoelectrode may have binding energy suitable for redox within the electrolyte and high exchange current density, but may not be limited thereto. For example, if binding energy between a hydrogen ion and the metal catalyst is too low, the hydrogen ion can be easily desorbed, and, thus, a reduction reaction may hardly occur, and if the binding energy is too high, a reduced hydrogen gas may be hardly desorbed from the metal catalyst, and, thus, the catalytic activity may be decreased, but the present disclosure may not be limited thereto.

In an exemplary embodiment of the present disclosure, the metal catalyst in the catalyst layer may be continuously or discontinuously formed, but may not be limited thereto.

In an exemplary embodiment of the present disclosure, the catalyst layer may be in the form of, for example, nanoparticles, thin film, or 3D nanostructure, but may not be limited thereto.

A second aspect of the present disclosure provides a photoelectrochemical cell including: the photoelectrode according to the first aspect of the present disclosure; a counter electrode electrically connected with the photoelectrode; and an electrolyte.

All the descriptions of the photoelectrode in accordance with the first aspect of the present disclosure can be applied to the second aspect of the present disclosure, and the omission of the descriptions in the second aspect of the present disclosure does not mean to exclude the application of the descriptions to the second aspect of the present disclosure.

In an exemplary embodiment of the present disclosure, the counter electrode and the electrolyte may include those typically used in the field of use of photoelectrodes to which the present disclosure pertains. For example, the counter electrode may be an Au, Cu, Ag, Pt, Pd, Rh, Ir, Re, Ni, Co, Mo, Nb, IrOx, RuOx, PdOx, or NiOx electrode, and the electrolyte may be a solution containing $H^+$ and $OH^-$ and having a pH of 0 to 14, but may not be limited thereto.

In an exemplary embodiment of the present disclosure, the photoelectrochemical cell may generate hydrogen or oxygen by splitting water, but may not be limited thereto.

In an exemplary embodiment of the present disclosure, the photoelectrochemical cell may reduce carbon dioxide, but may not be limited thereto.

A third aspect of the present disclosure provides a method of preparing a photoelectrode for cathode, including: forming an electrode on a substrate; forming a photoactive layer configured to receive light and generate an electron on the electrode; forming a catalyst retaining layer configured to improve the mobility of the electron on the photoactive layer; and forming a catalyst layer containing a metal catalyst on the catalyst retaining layer.

In an exemplary embodiment of the present disclosure, forming of a catalyst retaining layer may be performed by a spray coating method, but may not be limited thereto.

In an exemplary embodiment of the present disclosure, the catalyst retaining layer is formed by the spray coating method, and, thus, the process is completed in a short time (30 minutes) by a non-vacuum method at a low processing temperature of 70° C. Therefore, cost can be reduced and the process is relatively simple. Further, the catalyst retaining layer is formed by performing spray coating only two or three times and thus can be formed as several atomic layers. Therefore, the catalyst retaining layer has substantially the same transmittance as a glass substrate, and, thus, the loss of incident light caused by catalyst retaining layer is negligible.

Hereinafter, the present disclosure will be described in more detail with reference to the accompanying drawings and examples, but the scope of the present disclosure will not be limited to the present examples.

Examples

<Preparation of Photoelectrode>

Figure 2A:
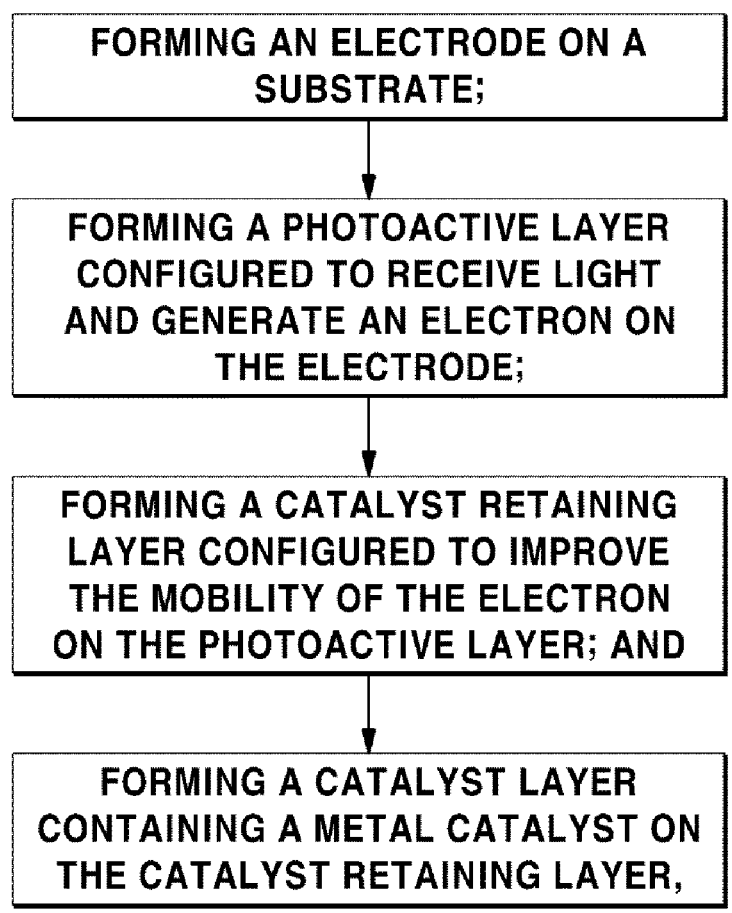
FIGS. 2A and 2B provide flowcharts illustrating a method of preparing a photoelectrode.
Figure 2B:
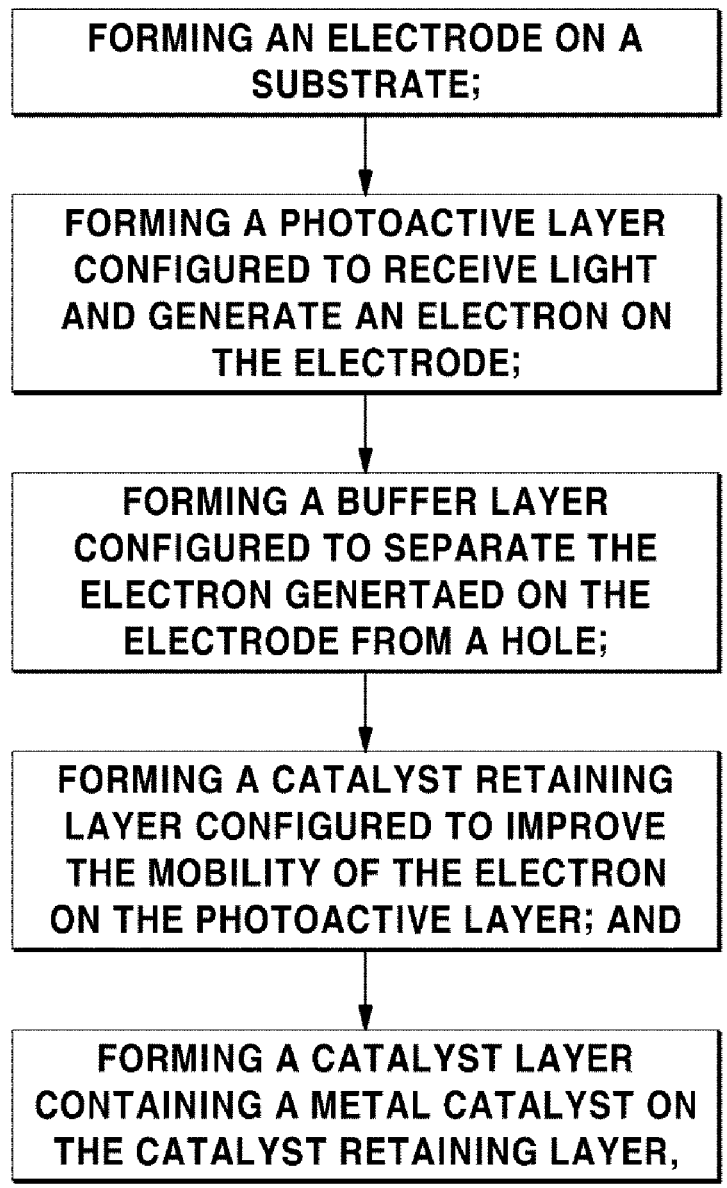

FIG. 1 is a schematic diagram illustrating an overall structure of a photoelectrode according to Example of the present disclosure, FIGS. 2A and 2B provide flowcharts illustrating a method of preparing a photoelectrode according to Example of the present disclosure, and FIG. 2A is a flowchart illustrating a method of preparing a photoelectrode having a lamination of electrode/photoactive layer/catalyst retaining layer/catalyst layer and FIG. 2B is a flowchart illustrating a method of preparing a photoelectrode having a lamination of electrode/photoactive layer/buffer layer/catalyst retaining layer/catalyst layer.

A transparent and rigid glass substrate was used as a substrate 110. However, the present disclosure is not limited thereto, and an opaque or translucent substrate may be used and a flexible substrate may also be used. For example, polyethylene terephthalate (PET), polyethylene naphthalate (PEN), or colorless polyimide may be used as a transparent substrate, and stainless steel (SUS) or polyimide (PI) may be used as an opaque substrate, but may not be limited thereto.

In the present example, molybdenum (Mo) was used as an electrode 120, and the electrode was formed to a thickness of about 700 nm by sputter deposition.

Further, $Cu(In,Ga)Se_2$ (hereinafter, referred to as "CIGS") was used as a photoactive layer 130.

The photoactive layer 130 was formed by sputter deposition, and a temperature of the glass/Mo substrate was maintained at 350° C. and Ar was maintained at 3 mTorr for sputtering. In the above-described conditions, In and Ga were co-sputtered and Cu was sputtered thereon. The formation of In,Ga/Cu as described above was defined as 1 cycle. The above-described process was repeated about 10 cycles until the photoactive layer had a thickness of from about 1.5 μm to about 1.7 μm. Finally, a heat treatment was performed at about 400° C. in a selenium (Se) overpressure (selenization). Through this process, a composite of polycrystalline $Cu_{0.9}(In_{0.7}Ga_{0.3})Se_2$ was prepared, and in the present example, the photoactive layer 130 was formed to a thickness of about 1.5 μm. The prepared photoactive layer 130 absorbed light and generated a charge (electron-hole pair) and functioned as a p-type semiconductor.

The photoactive layer 130 may include, for example, multinary chalcogenide besides the CIGS. The multinary chalcogenide may include binary, ternary, and quaternary chalcogenides. This group of materials may include compounds containing at least one element of Cu, In, Ga, Zn, Sn, Sb, or Ag and at least one element of S, Se, Te, or Ge. For example, the binary chalcogenide may include SnS, SnSe, $Sb_2S_3$, $Sb_2Se_3$, CdTe, and the like, the ternary chalcogenide may include $CuGaS_2$(CGS), $CuGaSe_2$(CGSe), $CuInS_2$ (CIS), $CuInSe_2$(CISe), $CuInTe_2$, $CuAlSe_2$, $AgInSe_2$, and the like, or the quaternary chalcogenide may include $Cu(In,Ga)Se_2$(CIGS), $Cu_2ZnSnS_4$(CZTS), $Cu_2ZnSnSe_4$(CZTSe), $Ag_2ZnSnS_4$, and the like.

The photoactive layer 130 may be formed by thermal co-evaporation, atomic layer deposition (ALD), molecular beam epitaxy, pulsed laser deposition (PLD) or chemical vapor deposition (CVD) as a vacuum deposition method and spin coating or electrodeposition as a non-vacuum deposition method besides the sputter deposition.

In the present example, the photoactive layer was formed by sputter deposition, and, thus, the composition of the photoactive layer can be controlled precisely and the photoactive layer can be formed as compact and large polycrystalline grains.

In the present example, CdS was used as a buffer layer 140.

For example, zinc sulfide (ZnS), indium sulfide ($In_2S_3$), zinc tin oxide ($Zn_xSn_yO_z$), zinc magnesium oxide ($Zn_xMg_yO_z$), zinc titanium oxide ($Zn_xTi_yO_z$), titanium oxide ($TiO_2$), cadmium oxy sulfide (Cd(O,S)), zinc oxy sulfide (Zn(O,S)), zinc selenide (ZnSe), and the like may be used as the buffer layer 140 in addition to CdS.

In a method of forming the buffer layer 140, a temperature of a water circulation bath was maintained at 90° C. and a Cd precursor (0.125 g of $CdSO_4$ dissolved in 200 mL of deionized water), a S precursor (1.52 g of Thiourea dissolved in 100 mL of deionized water), and 40 mL of ammonia (28 wt %) were mixed in the bath. In this case, a glass/Mo/CIGS sample was put into the solution, and when a temperature of an inner bath reached 65° C., the sample was removed and rinsed with deionized (DI) water. Then, the DI water was removed using a $N_2$ gun. By the above-described method, unnecessary oxide generated on the CIGS surface, i.e., the photoactive layer 130, was removed and the buffer layer 140 was formed to a uniform thickness of about 50 nm along the curves of the photoactive layer 130.

The CdS buffer layer in the present example functions as an n-type semiconductor capable of quickly separating an electron and a hole by forming a p-n junction with the photoactive layer. Particularly, in order to minimize the loss of light reaching the photoactive layer, it is preferable to use a material having a band gap of from about 2.2 eV to about 2.4 eV as the buffer layer and it is preferable to use a material having a high electronic conductivity.

In the present example, the buffer layer 140 was formed by chemical bath deposition. Besides the above-described method of forming the buffer layer, for example, vacuum deposition (thermal evaporation, sputtering, atomic layer deposition, molecular beam epitaxy, chemical vapor deposition, etc.) and non-vacuum deposition (chemical bath deposition) may be used.

In the present example, reduced graphene oxide (rGO) was used as a catalyst retaining layer 150. FIG. 3 is a schematic diagram illustrating a process of forming a catalyst retaining layer according to Example of the present disclosure.

Besides the reduced graphene oxide (rGO), for example, graphene oxide (GO), graphene, graphite, and the like may be used as the catalyst retaining layer.

In order to prepare the reduced graphene oxide (rGO), graphene oxide (GO) powder was prepared by a "modified Hummer's method". The graphene oxide (GO) was put into DI water and ultrasonicated for about 30 minutes to be uniformly dispersed therein. By the above-described method, a GO dispersion (1 mg/mL) was prepared. Then, 10 mL of the GO dispersion was mixed with 2 mL of a hydrazine solution (35 wt % in water) and 15 mL of ammonia (28 wt %). A container of the mixed solution was stirred for 1 hour in a water bath heated to 95° C., and as a result, a black rGO suspension was prepared within the solution. The rGO suspension was filtered through a "Teflon filter paper" (0.22 um pore size) and the remaining powder was rinsed several times with ethanol and DI water. Then, refined rGO powder (0.01 mg/m L) was ultrasonicated for 30 minutes in a mixed solution of DI water and ethanol (3:7). The rGO suspension 152 was sprayed two or three times through a spray gun S having a nozzle size of about 0.3 mL to CIGS/CdS on the substrate heated to 70° C. As a result, rGO layers with various concentrations were spray-coated from the rGO suspension to a thickness of from about 0.34 nm to about 1 nm on CIGS/CdS.

The spray coating method used in the present disclosure is not limited to the roughness and geometric morphology of a material and very advantageous for a large-area substrate. In a spin coating method and a blade coating method, about 90% or more of a solution was thrown away. Therefore, the spray coating method according to the present example is very advantageous even in terms of cost.

Since the catalyst retaining layer is formed by the spray coating method, the process is completed in 30 minutes by the non-vacuum method at a low processing temperature of 70° C. Therefore, cost can be reduced and the process is relatively simple. Further, the catalyst retaining layer is formed by performing spray coating only two or three times and thus can be formed as several atomic layers. Therefore, the catalyst retaining layer has substantially the same transmittance as a glass substrate, and, thus, the loss of incident light caused by rGO is negligible.

The process of forming the catalyst retaining layer may include hydrazine hydrate treatment, plasma exposure, pulsed light exposure, heat treatment with urea, direct heating in a furnace, and electrochemical reduction besides the spray coating method.

In addition to the above-described method, the process of forming the catalyst retaining layer may include solution-based coating methods such as spin coating, blade coating, inkjet printing, and dip coating.

FIG. 4 is a schematic diagram illustrating the representative effects of a photoelectrode including a catalyst retaining layer according to Example of the present disclosure.

The rGO prepared according to the present disclosure is a material chemically reduced from GO and can maintain a very stable form in a photoelectrochemical (PEC) manner. Since the rGO is completely reduced from GO, unnecessary chemical changes such as reconversion from rGO to GO which may occur during a photoelectrochemical hydrogen generation reaction do not occur. Therefore, the rGO maintains a stable form even after a reaction for about 7 hours and binds the catalyst (e.g., Pt) and thus can effectively suppress catalyst loss such as segregation, in-diffusion of the catalyst, and desorption of the catalyst from the surface during a PEC reaction. This is because the rGO of the present disclosure retains various functional groups such as oxygenated species, dangling bonds, and kinks.

Further, a Pt catalyst is formed as nanoparticles having a size of several nm (about 5 nm) and thus cannot fully cover the surface of the buffer layer (CdS). Therefore, the CdS and the electrolyte have an interface there between, which may cause (photo) corrosion. However, if the rGO is formed as the catalyst retaining layer, the rGO does not have any portion in direct contact with the electrolyte and thus can function to suppress corrosion. The rGO has high electrical conductivity and thus can effectively disperse electrons photoexcited by the sparsely present Pt catalyst and reduce electron-hole recombination on the surface to improve a charge transfer rate. Accordingly, it is possible to effectively reduce a voltage drop which may occur when a lot of electrons are concentrated on a single catalyst.

In the present example, a Pt catalyst was used as a catalyst layer 160, and a process of forming the catalyst layer 160 is as follows.

The CIGS photoelectrode including rGO was put into a vacuum chamber and e-beam evaporation was performed to the Pt catalyst. The Pt catalyst was induced to be deposited slowly at a rate of about less than 1 A/s in the form of nanoparticles.

The process of forming the catalyst layer may include sputter deposition, pulsed laser deposition, atomic layer deposition, and molecular beam epitaxy as a vacuum deposition method or electrodeposition and photodeposition as a non-vacuum deposition method.

<Properties of Photoelectrode Including Catalyst Retaining Layer>

Figure 5:
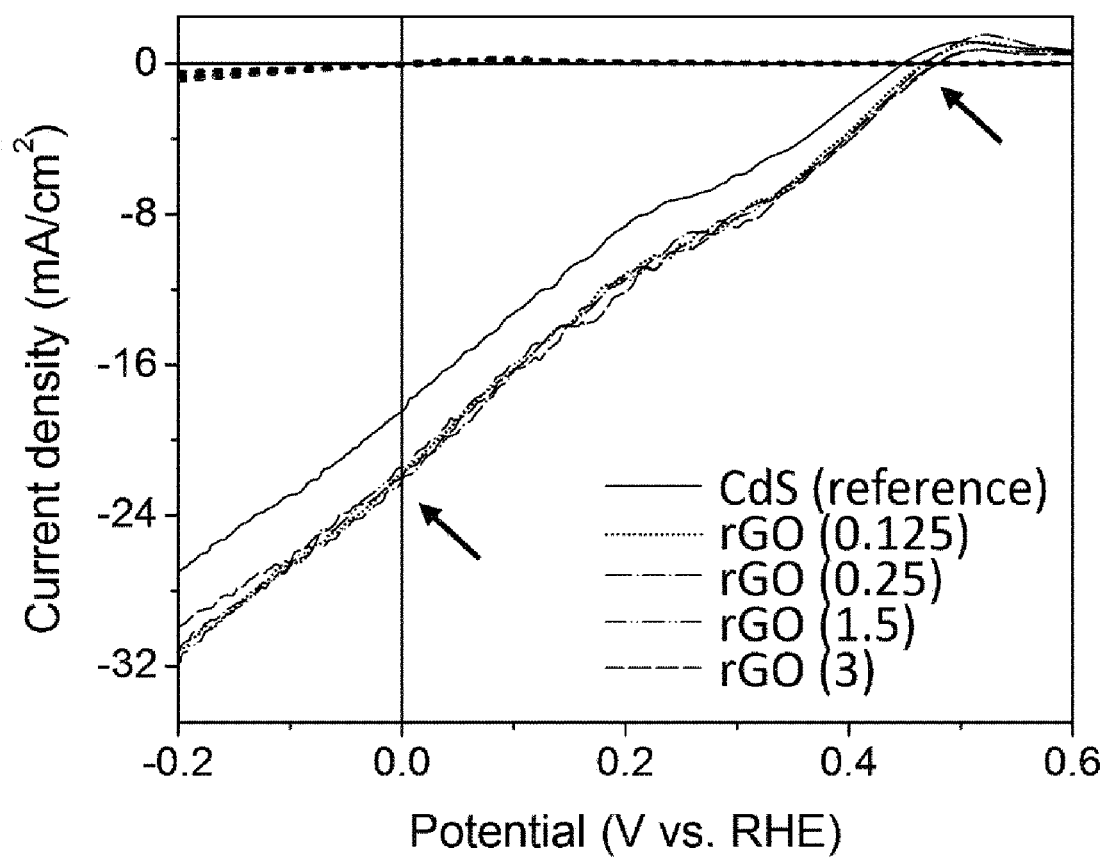
FIG. 5 is a graph showing the result of analyzing photoelectrochemical current-potential properties of a photoelectrode.

FIG. 5 is a graph showing the result of analyzing photoelectrochemical current-potential properties of a photoelectrode according to Example of the present disclosure.

FIG. 5 shows photoelectrochemical current-potential properties of a CIGS/CdS/Pt photocathode (reference) as Comparative Example and a CIGS/CdS/rGO/Pt photocathode as Example, and the photoelectrochemical properties of the photoelectrodes depending on a volume concentration (mL) of rGO can be seen.

As for the test conditions, the CIGS photocathode receives light and generates charges, and, thus, the test was conducted using a 300 W Xe lamp as a light source under 1 sun (AM 1.5 G, 100 mW/cm$^2$). A "potentiostat" (current-potential source) was used for measurement and configured to apply a potential and measure a photocurrent.

A 0.5 M phosphate buffer (0.5 M $Na_2SO_4$, 0.5 M $NaH_2PO_4$, 0.5 M $Na_2HPO_4$) was used as an electrolyte, and NaOH granules were added to the electrolyte to have a pH of 6.8. The present test was conducted to generate hydrogen using the CIGS photocathode. Thus, it is preferable to use an electrolyte in which an excessive amount of $H^+$ is dissolved. Since the electrolyte is close to neutral with a pH of 6.8, it is possible to avoid the risk of corrosion. The reaction can also occur in a strongly acid electrolyte such as $H_2SO_4$ or $HClO_4$, but in this case, the photoelectrochemical stability may be likely to be decreased.

A three-electrode system is needed for measurement. The three electrodes are a working electrode (WE), a counter electrode (CE), and a reference electrode (RE), respectively. In the present example, a CIGS photocathode, a Pt coil, and Ag/AgCl (3 M KCl) were used as the working electrode, the counter electrode and the reference electrode, respectively. On the basis of the reference electrode, when a potential is applied to the CIGS photocathode, a photoexcited electron is moved to the surface of the CIGS photocathode/electrolyte and involved in a hydrogen generation reaction, and a hole current corresponding to the potential was moved to the counter electrode and involved in an oxygen generation reaction.

The data were measured at room temperature and the scan range was from 0.6 $V_{RHE}$ to −0.2 V (reduction to oxidation) vs. reversible hydrogen electrode (RHE). The scan rate was 20 mV/sec and the reaction was carried out without stirring of the electrolyte. A dotted line in FIG. 5 indicates a dark current density, and it can be seen from the measurement of LSV without incident light that the current in a measurement range was close to 0. This means that unnecessary electrochemical reactions except the hydrogen generation reaction do not occur.

Table 1 shows the current densities and starting voltage values of Comparative Example and Examples illustrated in FIG. 5.

TABLE 1

| $J_{photo}$ @ 0 $V_{RHE}$ | $V_{on}$ @ 0 mA/cm$^2$ |
|---|---|
| −18.5 (CdS) | 0.45 (CdS) |
| −21.8 (0.125) | 0.48 (0.125) |
| −22.2 (0.25) | 0.48 (0.25) |
| −21.5 (1.5) | 0.48 (1.5) |
| −22.0 (3) | 0.48 (3) |

It can be seen from Table 1 and FIG. 5 that when Pt catalyst were formed by coating rGO with various concentrations (rGO-0.125, rGO-0.25, rGO-1.5, and rGO-3), the current densities and the starting voltages thereof are increased at 0 $V_{RHE}$ as compared with Comparative Example.

Figure 6A:
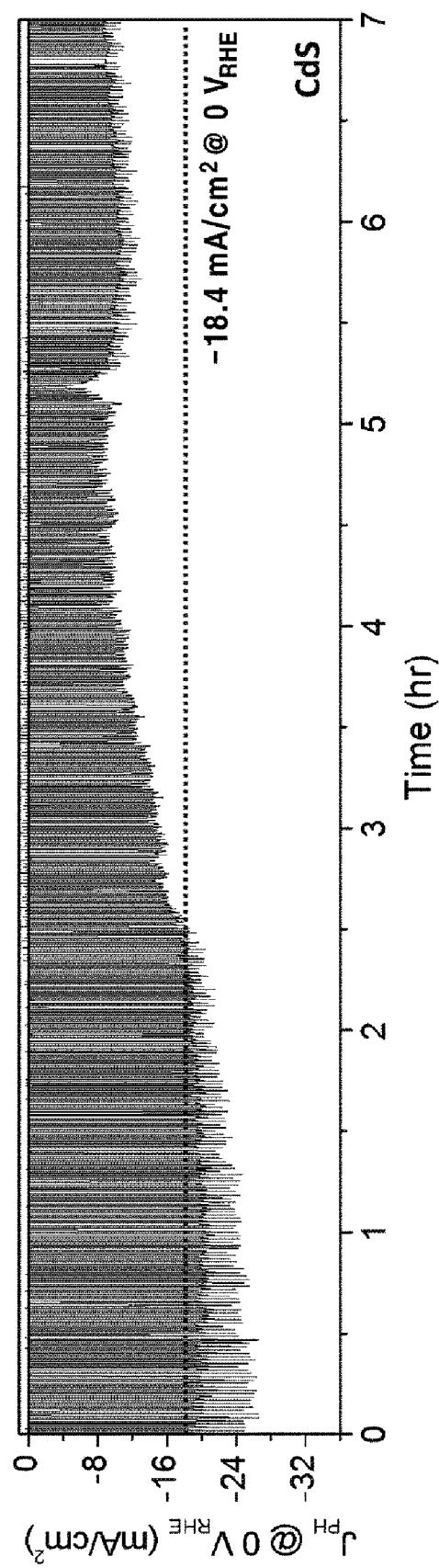
FIGS. 6A and 6B provide graphs showing the result of analyzing photoelectrochemical stability of a photoelectrode containing a Pt catalyst.
Figure 6B:
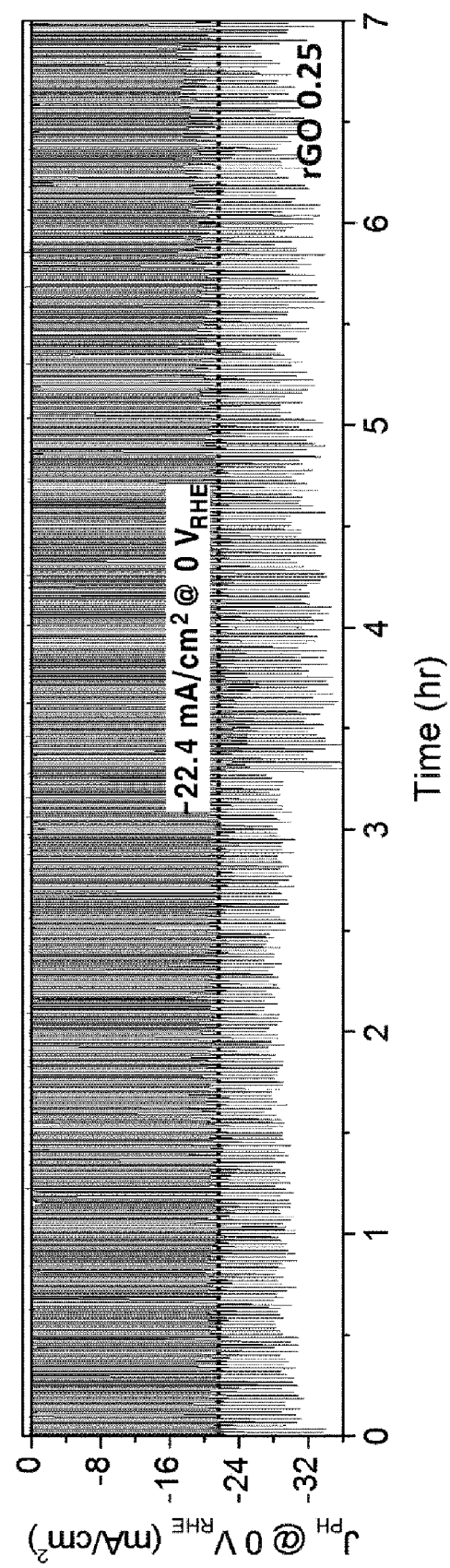

FIGS. 6A and 6B provide graphs showing the result of analyzing photoelectrochemical stability of a photoelectrode according to Example of the present disclosure.

FIG. 6A shows the result of photoelectrochemical stability test of a CIGS/CdS/Pt photocathode and FIG. 6B shows the result of photoelectrochemical stability test of a CIGS/CdS/rGO-0.25/Pt photocathode, and the tests were conducted by applying a constant potential under 1 sun conditions and measuring a change in photo current-density. The tests were conducted at room temperature without stirring under the conditions of a "potentiostat", a three-electrode system, 1 sun, and a 0.5 M phosphate buffer which are the same as those for the measurement of LSV.

The measurement was conducted by turning the light on and off every 30 seconds (light chopping) when irradiating 1 sun. That is, a photo current and a dark current were alternately measured every 30 seconds. In the two electrodes, unnecessary electrochemical reactions except a hydrogen generation reaction did not occur during the chronoamperometry measurement for 7 hours or more.

Figure 7A:
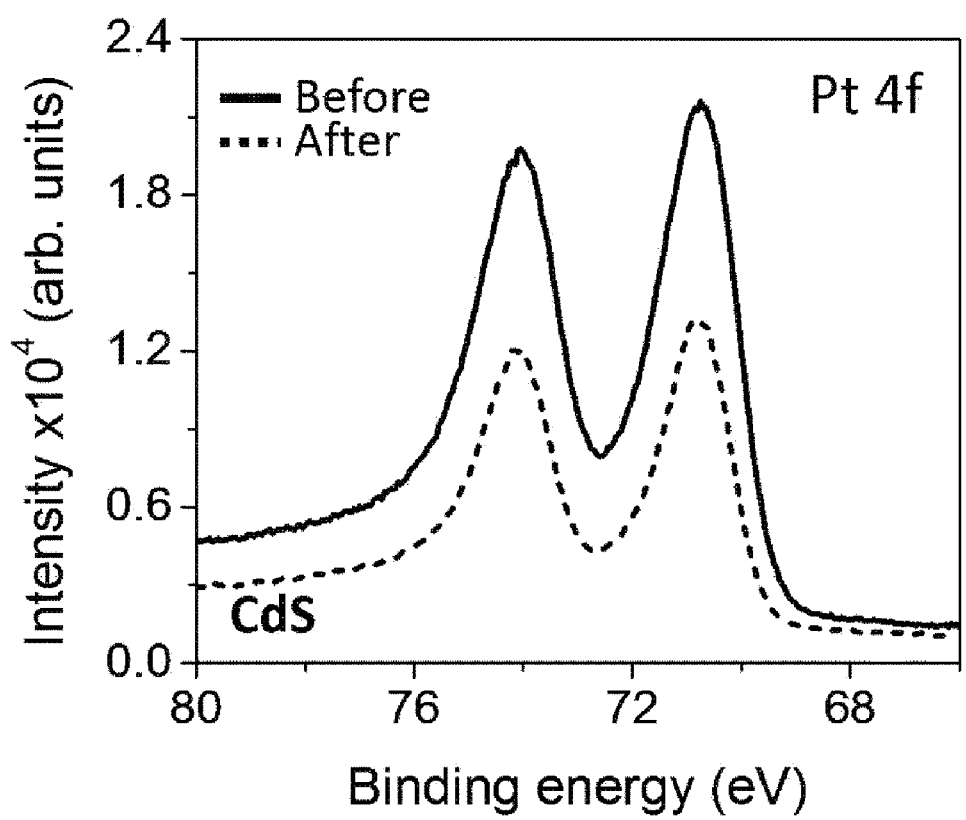
FIGS. 7A and 7B provide graphs showing the result of XPS analysis of Pt catalyst in a photoelectrode.
Figure 7B:
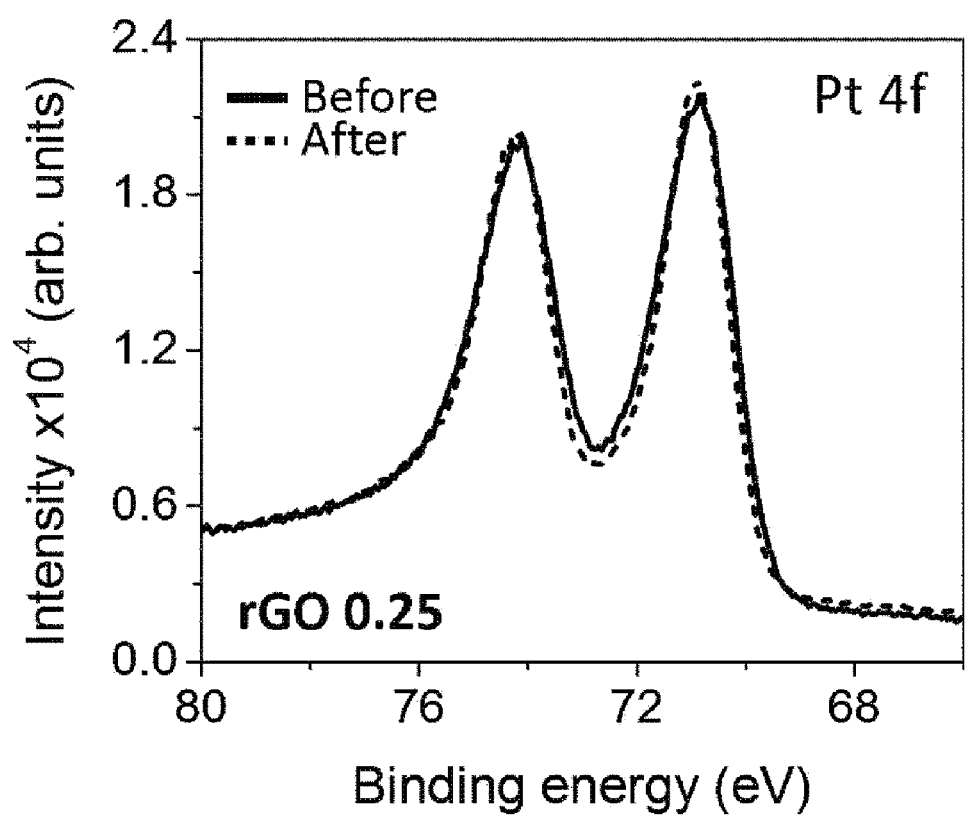

A decrease in photocurrent as shown in FIG. 6A is analyzed as being caused by the loss of the Pt catalyst. This can be confirmed from the result of the XPS measurement as shown in FIGS. 7A and 7B. The potential applied was 0 $V_{RHE}$, and a photo current-density at 0 $V_{RHE}$ was the same as the current density at 0 $V_{RHE}$ in the LSV of FIG. 5 (the dotted line in FIGS. 6A and 6B). It was confirmed that when rGO-0.25 was used from among rGO with various concentrations, the photo current-density continued for about 7 hours or more and the highest stability or sustainability was achieved.

FIGS. 7A and 7B provide graphs showing the result of XPS analysis of Pt catalyst residue in a photoelectrode according to Example of the present disclosure.

FIG. 7A and FIG. 7B are graphs comparing the intensity of Pt 4f before and after a chronoamperometry hydrogen generation reaction of a CIGS/CdS/Pt photocathode and a CIGS/CdS/rGO-0.25/Pt photocathode, respectively.

The XPS measurement was conducted under high vacuum of 1×10$^{-10}$ Torr and monochromatic Al Kα (1486.6 eV) was used as an X-ray source. The measurement of a core level of Pt 4f was conducted by integrating a binding energy step size of 50 meV (X-axis) and 10 scans. A peak was calibrated to the "Adventitious Carbon 1s" (284.5 eV).

It can be seen that the intensity after the reaction was decreased in CdS of Comparative Example (FIG. 7A), whereas the constant intensity was maintained during the reaction for 7 hours in rGO-0.25 of Example (FIG. 7B). Accordingly, it can be seen that the catalyst (Pt) was lost from CdS of Comparative Example during the reaction, but as for rGO-0.25, the catalyst layer was formed on the catalyst retaining layer (rGO) without catalyst loss.

FIG. 8A, FIG. 8B, FIG. 9A, and FIG. 9B provide graphs showing the result of analyzing photoelectrochemical stability of photoelectrodes for cathode when a Ni—Mo alloy and a Co catalyst are used as metal catalysts for the photoelectrodes for cathode according to Examples of the present disclosure, respectively.

Figure 8A:
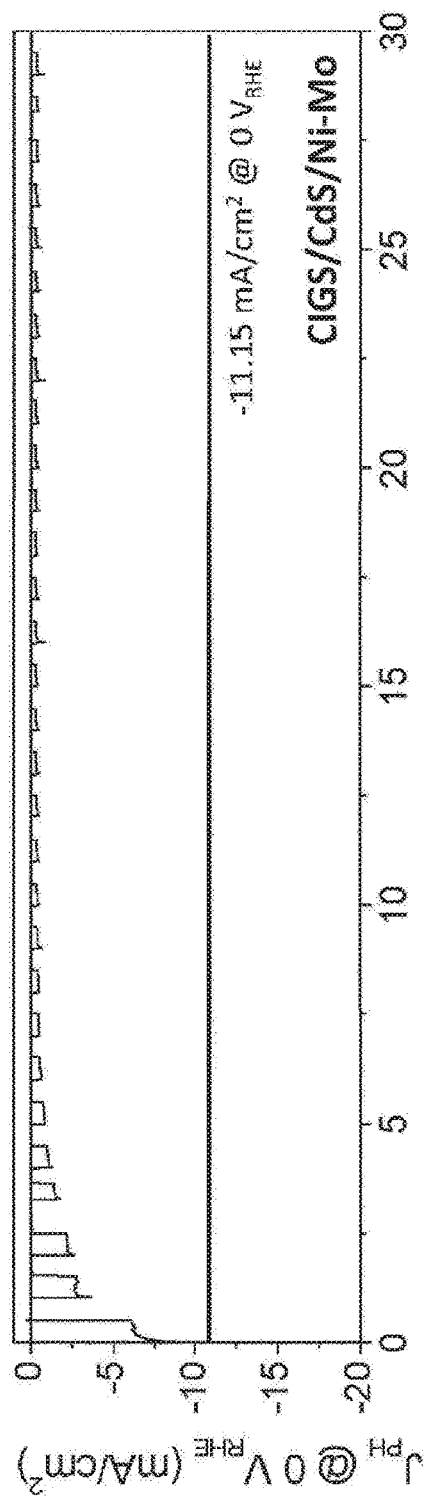
FIGS. 8A and 8B provide graphs showing the result of analyzing stability of a photoelectrode containing a Ni—Mo catalyst.
Figure 8B:
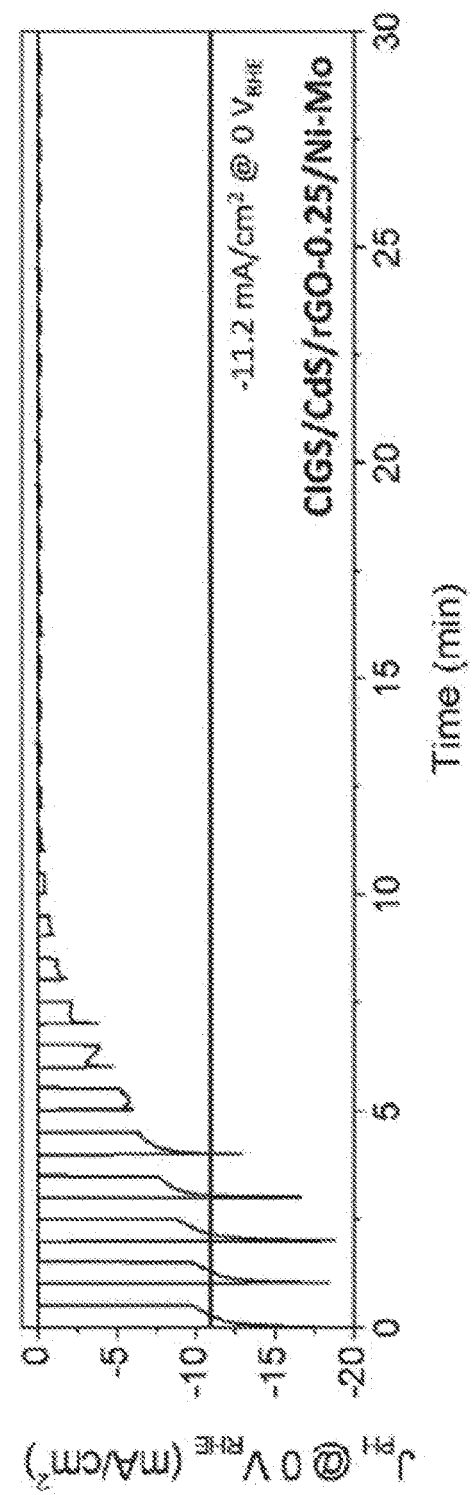

The photoelectrodes for cathode as shown in FIGS. 8A and 8B were prepared by the same method as that used for preparing the photocathode illustrated in FIGS. 6A and 6B except using a Ni—Mo alloy catalyst, and the Ni—Mo alloy catalyst with a ratio of Ni:Mo=7:3 was deposited to a thickness of 1.5 nm using an e-beam. FIG. 8A shows the result of analyzing photoelectrochemical stability of a CIGS/CdS/Ni—Mo photocathode and FIG. 8B shows the result of photoelectrochemical stability test of a CIGS/CdS/rGO-0.25/Ni—Mo photocathode.

Figure 9A:
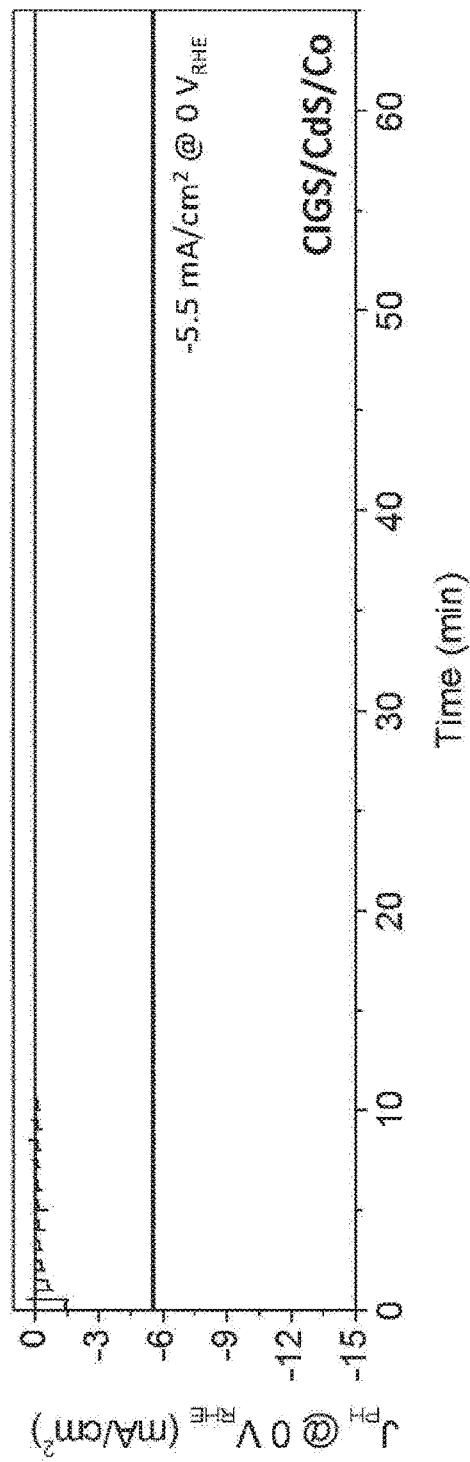
FIGS. 9A and 9B provide graphs showing the result of analyzing stability of a photoelectrode containing a Co catalyst.
Figure 9B:
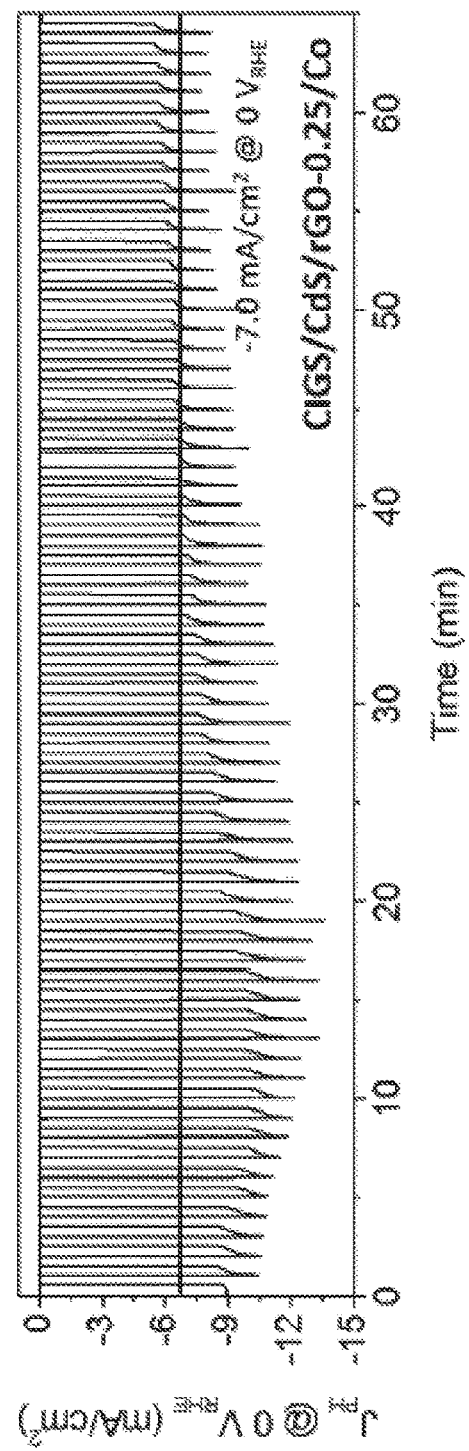

The photoelectrodes for cathode as shown in FIGS. 9A and 9B were prepared by the same method as that used for preparing the photocathode illustrated in FIGS. 6A and 6B except using a Co catalyst, and the Co catalyst was deposited to a thickness of 1.5 nm using an e-beam. FIG. 9A shows the result of analyzing photoelectrochemical stability of a CIGS/CdS/Co photocathode and FIG. 9B shows the result of photoelectrochemical stability test of a CIGS/CdS/rGO-0.25/Co photocathode.

We claim:

1. A photoelectrode for a cathode, comprising:
   an electrode formed on a substrate;
   a photoactive layer formed on the electrode and configured to receive light and generate an electron;
   a catalyst retaining layer formed on the photoactive layer to fully cover a surface of the photoactive layer, the catalyst retaining layer containing a carbonaceous material that includes reduced graphene oxide (rGO) and has a thickness of from 0.3 nm to 3 nm and being configured to improve the mobility of the electron; and
   a catalyst layer formed on the catalyst retaining layer and containing a metal catalyst,
   wherein the catalyst retaining layer binds the metal catalyst contained in the catalyst layer to reduce desorption of the metal catalyst from the catalyst layer.

2. The photoelectrode for cathode of claim 1, further comprising:
   a buffer layer between the photoactive layer and the catalyst retaining layer or between the electrode and the photoactive layer.

3. The photoelectrode for cathode of claim 1, wherein the catalyst layer includes an element selected from the group consisting of Pt, Co, Rh, Ir, Ru, Re, Au, Ag, Cu, Ni, Mo, Fe, Sn, Bi, Zn, Ga, Pb, Sn, Ti, In, Cd, W, Ta, Nb, and combinations thereof.

4. The photoelectrode for cathode of claim 1, wherein the catalyst layer is in the form of nanoparticles, thin film, or 3D nanostructure.

5. A photoelectrochemical cell comprising:
   a photoelectrode for cathode of claim 1;
   a counter electrode electrically connected with the photoelectrode for cathode; and
   an electrolyte.

6. The photoelectrochemical cell of claim 5, wherein the photoelectrochemical cell generates hydrogen by splitting water.

7. The photoelectrochemical cell of claim 5, wherein the photoelectrochemical cell reduces carbon dioxide.

8. A method of preparing a photoelectrode for cathode, comprising:
   forming an electrode on a substrate;
   forming a photoactive layer configured to receive light and generate an electron on the electrode;
   forming a catalyst retaining layer to fully cover a surface of the photoactive layer, the catalyst retaining layer containing a carbonaceous material that includes reduced graphene oxide (rGO) and has a thickness of from 0.3 nm to 3 nm, and being configured to improve the mobility of the electron on the photoactive layer; and
   forming a catalyst layer containing a metal catalyst on the catalyst retaining layer,
   wherein the catalyst retaining layer binds the metal catalyst contained in the catalyst layer to reduce desorption of the metal catalyst from the catalyst layer.

9. The method of preparing a photoelectrode for cathode of claim 8, wherein the forming of a catalyst retaining layer is performed by a spray coating method.

* * * * *